(12) United States Patent
Huang (10) Patent No.: US 12,183,851 B2
(45) Date of Patent: Dec. 31, 2024

(54) LED EPITAXIAL STRUCTURE AND MANUFACTURING METHOD THEREFOR, LIGHT EMITTING DEVICE AND DISPLAY PANEL

(71) Applicant: CHONGQING KONKA PHOTOELECTRIC TECHNOLOGY RESEARCH INSTITUTE CO., LTD., Chongqing (CN)

(72) Inventor: Kuo-Tung Huang, Chongqing (CN)

(73) Assignee: CHONGQING KONKA PHOTOELECTRIC TECHNOLOGY RESEARCH INSTITUTE CO., LTD., Chongqing (CN)

(*) Notice: Subject to any disclaimer, the term of this patent is extended or adjusted under 35 U.S.C. 154(b) by 469 days.

(21) Appl. No.: 17/770,284

(22) PCT Filed: Dec. 31, 2020

(86) PCT No.: PCT/CN2020/142221
§ 371 (c)(1),
(2) Date: Apr. 19, 2022

(87) PCT Pub. No.: WO2022/141428
PCT Pub. Date: Jul. 7, 2022

(65) Prior Publication Data
US 2023/0163235 A1  May 25, 2023

(51) Int. Cl.
*H01L 33/00* (2010.01)
*H01L 33/06* (2010.01)
*H01L 33/10* (2010.01)

(52) U.S. Cl.
CPC .............. *H01L 33/06* (2013.01); *H01L 33/10* (2013.01)

(58) Field of Classification Search
CPC .......... H01L 33/06; H01L 33/10; H01L 33/22
See application file for complete search history.

(56) References Cited

U.S. PATENT DOCUMENTS 11,444,216 B2 * 9/2022 Cardwell ............ H01L 31/1892
2011/0186812 A1   8/2011 Kim et al.
(Continued)

FOREIGN PATENT DOCUMENTS

CN   102306691 A   1/2012
CN   102916096 A   2/2013
(Continued)

OTHER PUBLICATIONS

International Search Report for corresponding application PCT/CN2020/142221 filed Dec. 31, 2020; Mail date Oct. 11, 2021.
(Continued)

*Primary Examiner* — Thao P Le
(74) *Attorney, Agent, or Firm* — Samson G. Yu (57) ABSTRACT

The present disclosure relates to an LED epitaxial structure and a manufacturing method therefor, a light emitting device and a display panel. The LED epitaxial structure includes: a substrate, an N-type confinement layer, an active layer and a P-type confinement layer, which are disposed in sequence from bottom to top, wherein the active layer includes quantum well layers and quantum barrier layers, which are alternately disposed, a part of the quantum barrier layers are first quantum barrier layers, at least one of the quantum barrier layers is a second quantum barrier layer, the second quantum barrier layer is located between two first quantum barrier layers, and a thickness of the second quantum barrier layers is greater than a thickness of the first quantum barrier layers.

20 Claims, 4 Drawing Sheets

(56) References Cited

U.S. PATENT DOCUMENTS

| | | | |
|---|---|---|---|
| 2012/0119182 A1 | 5/2012 | Kim et al. | |
| 2022/0102572 A1* | 3/2022 | Zhang | H01L 31/02966 |
| 2022/0102588 A1* | 3/2022 | Zhang | H01L 33/42 |
| 2023/0155061 A1* | 5/2023 | Tanaka | H01L 21/02543 |
| | | | 257/98 |
| 2024/0222939 A1* | 7/2024 | Wang | H01S 5/3434 |
| 2024/0234628 A1* | 7/2024 | Shin | H01L 33/32 |
| 2024/0297267 A1* | 9/2024 | Armitage | H01L 33/06 |
| 2024/0297271 A1* | 9/2024 | Zhu | H01L 33/025 |

FOREIGN PATENT DOCUMENTS

| | | |
|---|---|---|
| CN | 104167474 A | 11/2014 |
| CN | 105742433 A | 7/2016 |
| CN | 107093841 A | 8/2017 |
| CN | 108550665 A | 9/2018 |
| CN | 108767075 A | 11/2018 |
| CN | 109300852 A | 2/2019 |
| CN | 111048631 A | 4/2020 |
| EP | 2927966 A1 | 10/2015 |

OTHER PUBLICATIONS

CN first Search Report for corresponding application 202011639472.3 filed Dec. 31, 2020; Issue date Mar. 17, 2022.

* cited by examiner

LED EPITAXIAL STRUCTURE AND MANUFACTURING METHOD THEREFOR, LIGHT EMITTING DEVICE AND DISPLAY PANEL

CROSS-REFERENCE TO RELATED APPLICATION

This is a continuation of International Application No. PCT/CN2020/142221 filed on Dec. 31, 2020, the disclosure of which is incorporated herein by reference in its entirety.

TECHNICAL FIELD

The present disclosure relates to the field of display, and in particular to an LED epitaxial structure and a manufacturing method therefor, a light emitting device and a display panel.

BACKGROUND ART

With the maturity of MOCVD (Metal-Organic Chemical Vapor Deposition, metal-organic chemical vapor deposition) technology, a high-quality lattice-matched AlGaInP quantum well epitaxial layer can be prepared on a GaAs substrate. AlGaInP has the characteristics of direct transition, and high recombination luminous efficiency. A band gap can be adjusted with a change of Al composition, so as to realize high-brightness light emission of an LED (Light Emitting Diode, light emitting diode) within an ultra-wide wavelength range of 560 nm to 650 nm from red light to blue-green light.

At present, main factors affecting the luminous efficiency of LEDs is light extraction efficiency and light conversion efficiency, for example, absorption of light by a GaAs substrate material and critical angle loss of total reflection, etc.

Therefore, how to improve the luminous efficiency of LEDs is an urgent problem to be solved.

SUMMARY

The present disclosure provides an LED epitaxial structure, the LED epitaxial structure includes: a substrate, an N-type confinement layer, an active layer and a P-type confinement layer which are disposed in sequence from bottom to top, wherein the active layer includes quantum well layers and quantum barrier layers, which are alternately disposed, a part of the quantum barrier layers are first quantum barrier layers, at least one of the quantum barrier layers is a second quantum barrier layer, the second quantum barrier layer is located between two first quantum barrier layers, and a thickness of the second quantum barrier layers is greater than a thickness of the first quantum barrier layers.

Based on the same inventive concept, the present disclosure further provides a manufacturing method of an LED epitaxial structure, the manufacturing method of the LED epitaxial structure includes: providing a substrate; disposing an N-type confinement layer on the substrate; alternately disposing quantum well layers and quantum barrier layers on an exposed surface of the N-type confinement layer, so as to form an active layer, wherein a part of the quantum barrier layers are first quantum barrier layers, at least one of the quantum barrier layers is a second quantum barrier layer, the second quantum barrier layer is located between two first quantum barrier layers, and a thickness of the second quantum barrier layers is greater than a thickness of the first quantum barrier layers; and disposing a P-type confinement layer on an exposed surface of the active layer.

Based on the same inventive concept, the present disclosure further provides a light emitting device, includes an LED epitaxial structure, and the LED epitaxial structure including a substrate, an N-type confinement layer, an active layer and a P-type confinement layer which are disposed in sequence from bottom to top, wherein the active layer includes quantum well layers and quantum barrier layers, which are alternately disposed, a part of the quantum barrier layers are first quantum barrier layers, at least one of the quantum barrier layers is a second quantum barrier layer, the second quantum barrier layer is located between two first quantum barrier layers, and a thickness of the second quantum barrier layers is greater than a thickness of the first quantum barrier layers.

Based on the same inventive concept, the present disclosure further provides a display panel, including the light emitting device.

DESCRIPTION OF REFERENCE SIGNS 10, substrate; 20, buffer layer; 30, N-type confinement layer; 40, active layer; 50, P-type confinement layer; 60, transition layer; 70, window layer; 80, first spacer layer; 90, second spacer layer; 100, distributed Bragg reflection composite structure; 101, first reflectivity layer; 102, second reflectivity layer; 103, first composite sub-structure; 104, second composite sub-structure; 105, third composite sub-structure; 400, quantum well layer; 401, first quantum barrier layer; 402, second quantum barrier layer.

DETAILED DESCRIPTION OF THE EMBODIMENTS

In order to conveniently understand the present disclosure, the present disclosure will be described more comprehensively hereinafter with reference to related drawings. Preferred embodiments of the present disclosure are shown in the drawings. However, the present disclosure may be implemented in many different forms and is not limited to the embodiments described herein. On the contrary, these embodiments are provided so that the disclosure of the present disclosure is understood more thoroughly and comprehensively.

Unless otherwise defined, all technical and scientific terms used herein have the same meanings as commonly understood by those skilled in the art to which the present disclosure belongs. The terms used herein in the specification of the present disclosure are for the purpose of describing specific embodiments only, and are not intended to limit the present disclosure.

In the prior art, there is a problem of low luminous efficiency of LEDs.

On this basis, the present disclosure wishes to provide an LED epitaxial structure and a manufacturing method therefor, a light emitting device and a display panel. With regard to solutions for solving the above technical problems, the details of which will be described in subsequent embodiments.

Figure 1:
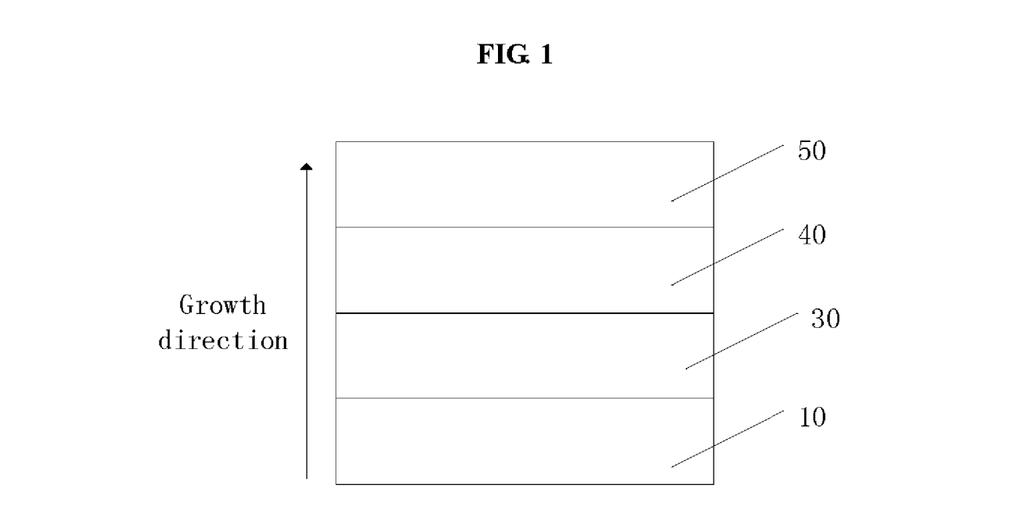
FIG. 1 is a schematic diagram of an LED epitaxial structure according to an embodiment of the present disclosure.
Figure 3:
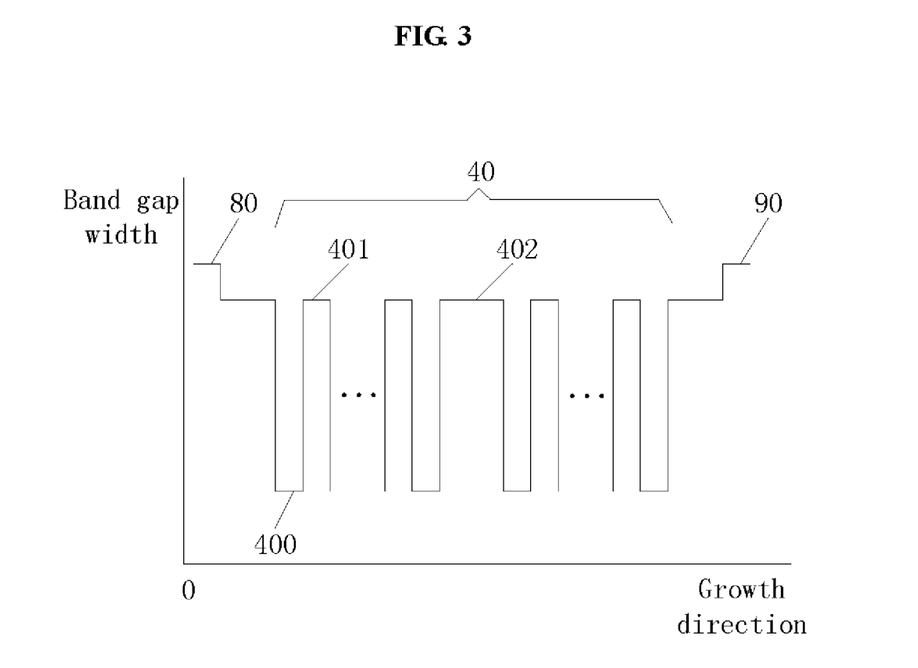
FIG. 3 is a schematic diagram of an active layer according to an embodiment of the present disclosure.

According to a typical embodiment of the present disclosure, an LED epitaxial structure is provided. As shown in FIG. 1, the LED epitaxial structure includes a substrate 10, an N-type confinement layer 30, an active layer 40 and a P-type confinement layer 50 which are disposed in sequence from bottom to top, wherein as shown in FIG. 3, the active layer 40 includes quantum well layers 400 and quantum barrier layers, which are alternately disposed, a part of the quantum barrier layers are first quantum barrier layers 401, at least one of the quantum barrier layers is a second quantum barrier layer 402, the second quantum barrier layer 402 is located between two first quantum barrier layers 401, and a thickness of the second quantum barrier layers 402 is greater than a thickness of the first quantum barrier layers 401.

The LED epitaxial structure includes the substrate, the N-type confinement layer, the active layer and the P-type confinement layer which are disposed in sequence from bottom to top, the active layer includes the quantum well layers and the quantum barrier layers, which are alternately disposed, the second quantum barrier layer is located between the two first quantum barrier layers, and the thickness of the second quantum barrier layers is greater than the thickness of the first quantum barrier layer. Compared with the prior art, the active layer in the LED epitaxial structure of the present disclosure includes quantum well pairs composed of a plurality of alternate quantum well layers and quantum barrier layers, thereby ensuring a greater number of quantum well pairs within the range of a carrier diffusion length, the second quantum barrier layer is disposed between the two first quantum barrier layers, which can achieve a better blocking effect on carriers, thereby improving the light conversion efficiency of an LED, in this way, the luminous efficiency of the LED is improved, and the problem of low luminous efficiency of the existing LEDs is also well alleviated.

In a specific embodiment, the material of the second quantum barrier layer is the same as that of the first quantum barrier layer.

According to a specific embodiment of the present disclosure, a well-barrier period is formed by one of the quantum well layers and one of the quantum barrier layers, which are adjacent to each other, the active layer includes M well-barrier periods, and the second quantum barrier layer is located between a (M/3)-th well-barrier period and a (2M/3)-th well-barrier period, wherein M is a positive integer greater than or equal to 15. Since the second quantum barrier layer is located between the (M/3)-th well-barrier period and the (2M/3)-th well-barrier period, a better blocking effect of the second quantum barrier on the carriers is further guaranteed, and higher brightness of the LED is further guaranteed.

It should be noted that, the number of M should not be too large, if M exceeds a certain number, it will not only make no contribution to the luminous efficiency of the LED, but will also become a light absorption center to reduce the luminous intensity of the LED. In a specific embodiment, M is 20.

In a practical application process, the LED epitaxial structure further includes a spacer layer, and the spacer layer is disposed between the N-type confinement layer and the active layer, and/or, between the active layer and the P-type confinement layer. That is to say, the spacer layer is disposed between the N-type confinement layer and the active layer; or, the spacer layer is disposed between the active layer and the P-type confinement layer; or, there are two spacer layers, one is disposed between the N-type confinement layer and the active layer, and the other is disposed between the active layer and the P-type confinement layer. The spacer layer plays the role of optical waveguide and temperature transition, so as to protect the quantum well layers and the quantum barrier layers.

Figure 2:
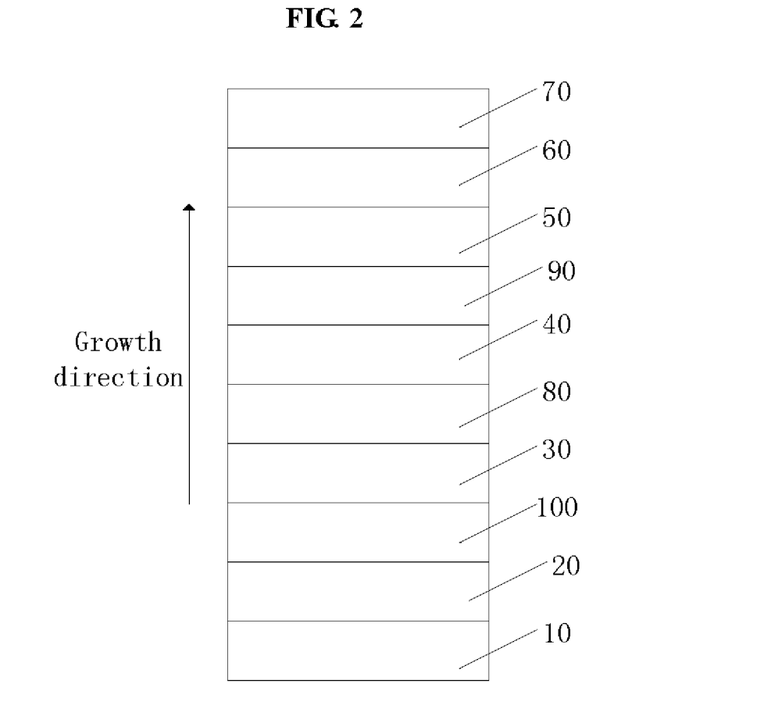
FIG. 2 is a schematic diagram of an LED epitaxial structure according to a specific embodiment of the present disclosure.

In a specific embodiment of the present disclosure, as shown in FIG. 2, there are two spacer layers, including a first spacer layer 80 and a second spacer layer 90, wherein the first spacer layer 80 is located between the active layer 40 and the N-type confinement layer 30, and the material of the first spacer layer 80 is the same as that of the quantum barrier layer; and the second spacer layer 90 is located between the active layer 40 and the P-type confinement layer 50, the material of the second spacer layer 90 is the same as that of the quantum barrier layer, and a growth temperature of the first spacer layer 80 and a growth temperature of the second spacer layer 90 are both the same as a growth temperature of the active layer. The first spacer layer plays the role of optical waveguide and temperature transition, so as to protect the quantum well layers and the quantum barrier layers. The second spacer layer plays the role of optical waveguide and temperature transition, so as to protect the quantum well layers and the quantum barrier layers, and it also prevents a diffusion of a P-type dopant into the quantum well layers and the quantum barrier layers.

In order to further ensure a higher brightness of the LED, according to yet another specific embodiment of the present disclosure, the growth temperature of the active layer is 10° C. to 25° C. lower than the growth temperature of the N-type confinement layer. In this way, it can be ensured that a band gap of the active layer is smaller, and the N-type confinement layer has a stronger confinement effect on the carriers, and compared with the N-type confinement layer, a change of the lattice of the active layer can improve the stress, which further ensures higher brightness and better wavelength uniformity of the LED.

In a specific embodiment, the growth temperature of the active layer is 10° C. to 20° C. lower than the growth temperature of the N-type confinement layer.

In yet another specific embodiment of the present disclosure, the material of the first spacer layer is the same as the material of the quantum barrier layer, which is silicon doped aluminum gallium indium phosphorus, the material of the second spacer layer is the same as the material of the quantum barrier layer, the thickness of the first spacer layer is between 70 nm and 150 nm, and the thickness of the second spacer layer is between 30 nm and 80 nm.

Figure 4:
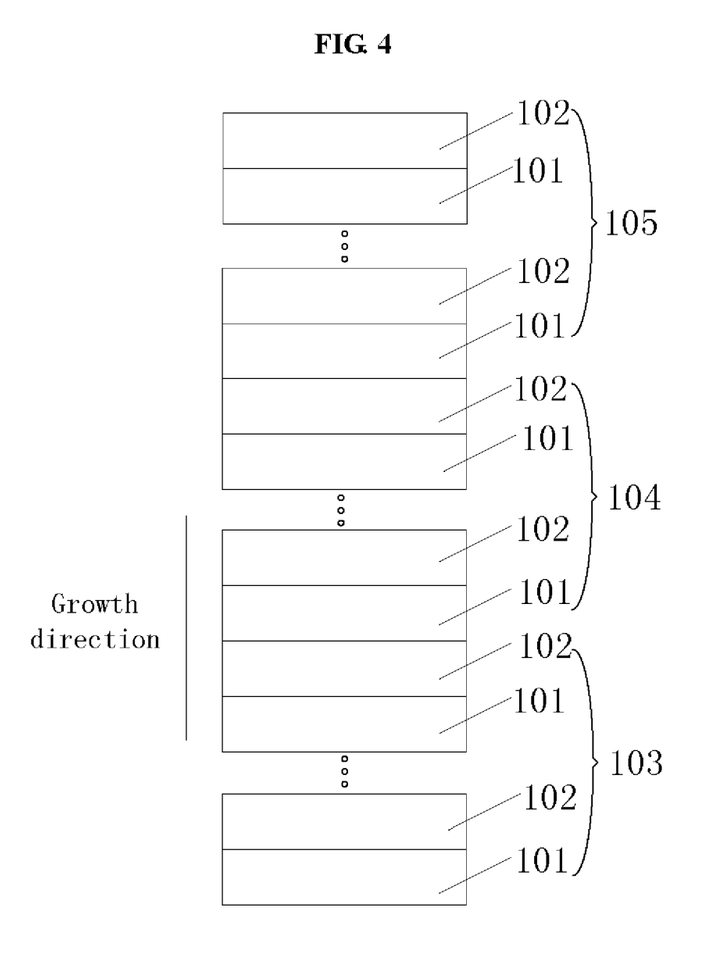
FIG. 4 is a schematic diagram of a distributed Bragg reflection composite structure according to an embodiment of the present disclosure.

In another specific embodiment of the present disclosure, as shown in FIG. 2 and FIG. 4, the LED epitaxial structure further includes a distributed Bragg reflection composite structure 100, and the distributed Bragg reflection composite structure 100 includes a first reflectivity layer 101 and a second reflectivity layer 102, which are disposed in a cyclically and alternately manner, wherein a reflectivity of the first reflectivity layer 101 is less than a reflectivity of the second reflectivity layer 102. In this way, the reflectivity of the distributed Bragg reflection composite structure to the ray of the active layer can be increased, and the critical loss of incident ray with a large inclination angle can be reduced, so as to achieve the purpose of improving the light extraction efficiency of the epitaxial structure.

In order to further ensure a greater reflectivity of the distributed Bragg reflection composite structure to the ray of the active layer, and further ensure higher luminous efficiency of the LED, according to yet another specific embodiment of the present disclosure, the distributed Bragg reflection composite structure includes, according to its growth direction, at least one stage of the composite sub-structures, wherein each stage of the composite sub-structures includes several pairs of the first reflectivity layers and the second reflectivity layers, which grow in a cyclically and alternately manner.

In another specific embodiment of the present disclosure, as shown in FIG. 4, the distributed Bragg reflection composite structure includes, according to its growth direction, a first composite sub-structure 103, a second composite sub-structure 104 and a third composite sub-structure 105, and reflection wavelengths of the first composite sub-structure 103, the second composite sub-structure 104 and the third composite sub-structure 105 gradually decrease. In this way, the reflectivity of the distributed Bragg reflection composite structure to the ray of the active layer can be increased, and the critical loss of the incident ray with the large inclination angle can be reduced, so as to achieve the purpose of improving the light extraction efficiency of the epitaxial structure.

In a specific embodiment, the reflection wavelength of the first composite sub-structure is $\lambda+100$ nm, the reflection wavelength of the second composite sub-structure is $\lambda+50$ nm, and the reflection wavelength of the third composite sub-structure is $\lambda$, wherein $\lambda$ represents a light emitting wavelength of the active layer.

In the actual application process, the number of alternating periods of the first reflectivity layer and the second reflectivity layer in the first composite sub-structure is less than the number of alternating periods of the first reflectivity layer and the second reflectivity layer in the second composite sub-structure, and the number of the alternating periods of the first reflectivity layer and the second reflectivity layer in the second composite sub-structure is less than the number of alternating periods of the first reflectivity layer and the second reflectivity layer in the third composite sub-structure. By setting the first composite sub-structure, the second composite sub-structure and the third composite sub-structure with different numbers of alternating periods, the reflectivity of the distributed Bragg reflection composite structure to the ray of the active layer can be increased, and the critical loss of the incident ray with the large inclination angle can be reduced, so as to achieve the purpose of improving the light extraction efficiency of the epitaxial structure.

In a specific embodiment, the number of alternating periods of the first reflectivity layer and the second reflectivity layer in the first composite sub-structure is 7, the number of alternating periods of the first reflectivity layer and the second reflectivity layer in the second composite sub-structure is 8, and the number of alternating periods of the first reflectivity layer and the second reflectivity layer in the third composite sub-structure is 15. Of course, in practical applications, it is not limited to the above-mentioned specific numerical values, and may also be other feasible specific numerical values.

According to yet another specific embodiment of the present disclosure, the material of the first reflectivity layer is silicon doped aluminum arsenide, and the material of the second reflectivity layer is silicon doped aluminum gallium arsenide. The number of aluminum atoms in the material of the second reflectivity layer is 46% of the total number of atoms in the second reflectivity layer.

In yet another specific embodiment of the present disclosure, the quantum well layer includes an aluminum gallium indium phosphorus layer, the number of aluminum atoms is 1.25% to 2.5% of the total number of atoms in the quantum well layer, the quantum barrier layer includes an aluminum gallium indium phosphorus layer, and the number of aluminum atoms is 15% to 17.5% of the total number of atoms in the quantum barrier layer. This further ensures a better blocking effect on the carriers, thereby ensuring higher brightness of the LED.

In another specific embodiment of the present disclosure, the LED epitaxial structure is a red light LED epitaxial structure, and the thickness of the quantum well layer is between 5 nm and 8 nm, therefore while ensuring a better blocking effect on the carriers, it ensures that the light emitting wavelength of the LED epitaxial structure can reach a predetermined wavelength value; in order to further ensure that the first quantum barrier layer is adapted to the quantum well layer, and meanwhile to further avoid the problem that the first quantum barrier layer absorbs light due to being too thick, thereby reducing the luminous intensity of the LED, the thickness of the first quantum barrier layer is between 8 nm and 12 nm; and when there are a plurality of second quantum barrier layers, the sum of the thicknesses of all the second quantum barrier layers is between 70 nm and 140 nm, and when there is only one second quantum barrier layer, the thickness of the second quantum layer is between 70 nm and 140 nm, thereby while ensuring a better confinement effect of the second quantum barrier layer on the carriers, and further ensuring that the LED epitaxial structure is relatively flat, thus no warping problem will occur.

In the actual application process, as shown in FIG. 2, the LED epitaxial structure further includes a buffer layer 20, a window layer 70 and a transition layer 60, wherein the buffer layer 20 is located between the substrate 10 and the N-type confinement layer 30; the window layer 70 is located on the side of the P-type confinement layer 50 that is away from the active layer 40; and the transition layer 60 is located between the P-type confinement layer 50 and the window layer 70.

In the actual application process, the materials of the substrate, the buffer layer, the N-type confinement layer, the P-type confinement layer, the transition layer and the window layer can be any materials in the prior art. In a specific embodiment, the material of the substrate is gallium arsenide, the material of the buffer layer is silicon doped gallium arsenide, the material of the N-type confinement layer is silicon doped aluminum indium phosphide, the material of the P-type confinement layer is aluminum indium phosphide doped with magnesium, zinc or carbon, the material of the transition layer is aluminum gallium indium phosphorus doped with magnesium, zinc or carbon, and the material of the window layer is gallium phosphide doped with magnesium, zinc or carbon.

Figure 5:
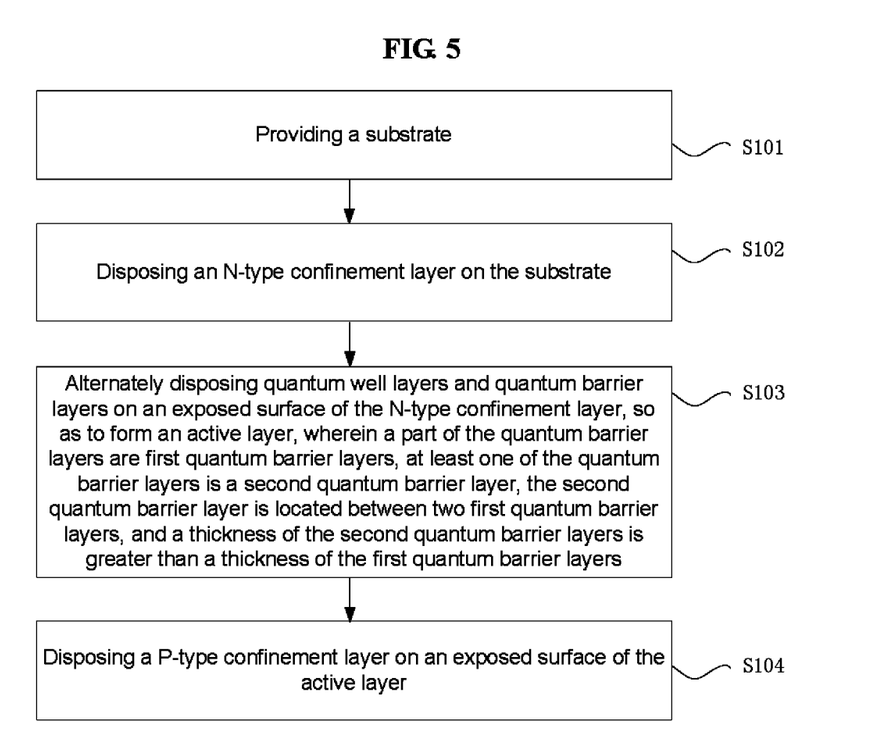
FIG. 5 is a schematic flow diagram of a manufacturing method of an LED epitaxial structure according to an embodiment of the present disclosure.

Based on the same inventive concept, the present disclosure further provides a manufacturing method of an LED epitaxial structure. FIG. 5 shows a schematic flow diagram of the manufacturing method of the LED epitaxial structure according to an embodiment of the present disclosure. As shown in FIG. 5, the manufacturing method includes the following steps:

Step S101, providing a substrate 10;

step S102, disposing an N-type confinement layer 30 on the substrate 10;

step S103, alternately disposing quantum well layers 400 and quantum barrier layers on an exposed surface of the N-type confinement layer 30, so as to form an active layer 40, wherein a part of the quantum barrier layers are first quantum barrier layers 401, at least one of the quantum barrier layers is a second quantum barrier layer 402, the second quantum barrier layer 402 is located between two first quantum barrier layers 401, and a thickness of the second quantum barrier layers 402 is greater than a thickness of the first quantum barrier layers 401; and step S104, disposing a P-type confinement layer 50 on an exposed surface of the active layer 40. A structure diagram of the LED epitaxial shown in FIG. 1 and a structure diagram of the active layer shown in FIG. 3 are obtained.

The manufacturing method of the LED epitaxial structure includes: firstly, providing the substrate; then disposing the N-type confinement layer on the substrate; thereafter, alternately disposing the quantum well layers and the quantum barrier layers on the exposed surface of the N-type confinement layer, so as to form the active layer, wherein the active layer includes the first quantum barrier layers and the second quantum barrier layers, and the second quantum barrier layer is located between the two first quantum barrier layers; and finally, disposing the P-type confinement layer on the exposed surface of the active layer. Compared with the prior art, the above manufacturing method of the present disclosure has the advantages that: quantum well pairs composed of a plurality of alternate quantum well layers and quantum barrier layers are disposed on the active layer, thereby ensuring a greater number of quantum well pairs within the range of a carrier diffusion length, and the second quantum barrier layer is disposed between the two first quantum barrier layers, which can achieve a better blocking effect on carriers, thereby improving the light conversion efficiency of an LED, and then the luminous efficiency of the LED is improved, and the problem of low luminous efficiency of the existing LEDs is also well alleviated.

In a specific embodiment, the material of the second quantum barrier layer is the same as that of the first quantum barrier layer.

In a specific embodiment of the present disclosure, the step of forming the active layer includes: periodically growing the quantum well layers and the first quantum barrier layers on the N-type confinement layer, so as to form N well-barrier periods, wherein one of the well-barrier periods includes one of the quantum well layers and one of the first quantum barrier layers, which are adjacent to each other, N is an integer less than M/3, and M is a positive integer greater than or equal to 15; alternately growing the quantum well layers and the quantum barrier layers on the N well-barrier periods, so as to form N well-barrier periods, wherein at least one of the well-barrier periods includes the second quantum barrier layer; and alternately growing the quantum well layers and the first quantum barrier layers on 2N well-barrier periods, so as to form (M−2N) well-barrier periods. In this way, the active layer can be formed relatively simply, while ensuring that the second quantum barrier layer is located between the two first quantum barrier layers, thereby further ensuring a better blocking effect of the second quantum barrier layer on the carriers, and further ensuring higher brightness of the LED. Of course, those skilled in the art can also form the active layer by means of other methods.

It should be noted that, the number of M should not be too large, if M exceeds a certain number, it will not only make no contribution to the luminous efficiency of the LED, but will also become a light absorption center to reduce the luminous intensity of the LED. In a specific embodiment, M is 20.

According to another specific embodiment of the present disclosure, after disposing the N-type confinement layer, and before disposing the active layer, the manufacturing method further includes: reducing a reaction temperature after growing the N-type confinement layer, and growing a first spacer layer at the reaction temperature; and/or, after disposing the active layer, and before disposing the P-type confinement layer, the manufacturing method further includes: growing a second spacer layer on the active layer, increasing the reaction temperature after growing the second spacer layer, and growing the P-type confinement layer at the reaction temperature. The first spacer layer plays the role of temperature transition and optical waveguide, so as to protect the quantum well layers and the quantum barrier layers. The second spacer layer plays the role of temperature transition and optical waveguide, so as to protect the quantum well layers and the quantum barrier layers, and it also prevents a diffusion of a P-type dopant into the quantum well layers and the quantum barrier layers.

In a specific embodiment, after disposing the N-type confinement layer, and before disposing the active layer 40, the manufacturing method further includes: disposing a first spacer layer 80 on the N-type confinement layer 30, wherein the material of the first spacer layer 80 is the same as the material of the quantum barrier layer; and after disposing the active layer 40, and before disposing the P-type confinement layer 50, the manufacturing method further includes: disposing a second spacer layer 90 on the active layer 40, wherein the material of the second spacer layer 90 is the same as the material of the quantum barrier layer, and a growth temperature of the first spacer layer 80 and a growth temperature of the second spacer layer 90 are the same as a growth temperature of the active layer 40. The structure diagram of the LED epitaxial structure diagram shown in FIG. 2 is obtained.

In order to further ensure a higher brightness of the LED, according to yet another specific embodiment of the present disclosure, the growth temperature of the active layer is 10° C. to 25° C. lower than the growth temperature of the N-type confinement layer. In this way, it can be ensured that a band gap of the active layer is smaller, and the N-type confinement layer has a stronger confinement effect on the carriers, and compared with the N-type confinement layer, a change of the lattice of the active layer can improve the stress, which further ensures higher brightness and better wavelength uniformity of the LED.

In a specific embodiment, the growth temperature of the active layer is 10° C. to 20° C. lower than the growth temperature of the N-type confinement layer.

In yet another specific embodiment of the present disclosure, the material of the first spacer layer is the same as the material of the quantum barrier layer, which is silicon doped aluminum gallium indium phosphorus, the material of the second spacer layer is the same as the material of the quantum barrier layer, the thickness of the first spacer layer is between 70 nm and 150 nm, and the thickness of the second spacer layer is between 30 nm and 80 nm.

In yet another specific embodiment of the present disclosure, before disposing the N-type confinement layer, the manufacturing method further includes: periodically growing a first reflectivity layer 101 and a second reflectivity layer 102 on the substrate, so as to form a distributed Bragg reflection composite structure as shown in FIG. 4, wherein a reflectivity of the first reflectivity layer 101 is less than a reflectivity of the second reflectivity layer 102. In this way, the reflectivity of the distributed Bragg reflection composite structure to the ray of the active layer can be increased, and the critical loss of incident ray with a large inclination angle can be reduced, so as to achieve the purpose of improving the light extraction efficiency of the epitaxial structure.

In yet another specific embodiment of the present disclosure, the method for forming the distributed Bragg reflection composite structure can include: periodically growing the first reflectivity layer 101 and the second reflectivity layer 102 on the substrate, so as to form a first composite sub-structure 103, wherein a reflection wavelength of the first composite sub-structure is λ+100 nm; alternately disposing the first reflectivity layer 101 and the second reflectivity layer 102 on the first composite sub-structure 103, so as to form a second composite sub-structure 104, wherein the reflection wavelength of the second composite sub-structure 104 is λ+50 nm; alternately disposing the first reflectivity layer 101 and the second reflectivity layer 102 on the second composite sub-structure 104, so as to form a third composite sub-structure 105, wherein the reflection wavelength of the third composite sub-structure 105 is λ, λ represents a light emitting wavelength of the active layer, and the first composite sub-structure 103, the second composite sub-structure 104 and the third composite sub-structures 105 form the distributed Bragg reflector composite structure 100, as shown in FIG. 4.

In an actual application process, the number of alternating periods of the first reflectivity layer and the second reflectivity layer in the first composite sub-structure is less than the number of alternating periods of the first reflectivity layer and the second reflectivity layer in the second composite sub-structure, and the number of alternating periods of the first reflectivity layer and the second reflectivity layer in the second composite sub-structure is less than the number of alternating periods of the first reflectivity layer and the second reflectivity layer in the third composite sub-structure. By setting the first composite sub-structure, the second composite sub-structure and the third composite sub-structure with different numbers of alternating periods, the reflectivity of the distributed Bragg reflection composite structure to the ray of the active layer can be increased, and the critical loss of the incident ray with the large inclination angle can be reduced, so as to achieve the purpose of improving the light extraction efficiency of the epitaxial structure.

In a specific embodiment, the number of alternating periods of the first reflectivity layer and the second reflectivity layer in the first composite sub-structure is 7, the number of alternating periods of the first reflectivity layer and the second reflectivity layer in the second composite sub-structure is 8, and the number of alternating periods of the first reflectivity layer and the second reflectivity layer in the third composite sub-structure is 15. Of course, in practical applications, it is not limited to the above-mentioned specific numerical values, and may also be other feasible specific numerical values.

According to yet another specific embodiment of the present disclosure, the material of the first reflectivity layer is silicon doped aluminum arsenide, and the material of the second reflectivity layer is silicon doped aluminum gallium arsenide. The number of aluminum atoms in the material of the second reflectivity layer is 46% of the total number of atoms in the second reflectivity layer.

According to yet another specific embodiment of the present disclosure, the temperature for growing the first reflectivity layer and the second reflectivity layer is 630° C. to 680° C., the pressure is 40 torr to 50 torr, the material of the first reflectivity layer is silicon doped aluminum arsenide, and the material of the second reflectivity layer is silicon doped aluminum gallium arsenide.

In the actual application process, as shown in FIG. 2, after providing the substrate 10 and before disposing the N-type confinement layer 30 on the substrate 10, the method further includes: forming a buffer layer 20 on the substrate 10; after disposing the P-type confinement layer 50 on the exposed surface of the active layer 40, the method further includes: sequentially forming a transition layer 60 and a window layer 70 on the P-type confinement layer 50.

According to yet another specific embodiment of the present disclosure, the step of sequentially disposing the buffer layer, the N-type confinement layer, the active layer, the P-type confinement layer, the transition layer and the window layer on the substrate includes: heating up to 650° C. to 710° C. in an $H_2/AsH_3$ environment under a pressure of 50 torr, and treating the gallium arsenide substrate in a reaction chamber for 3 min to 8 min; lowering the temperature to 640° C. to 690° C., maintaining the pressure at 40 torr to 50 torr, and feeding trimethyl gallium into the reaction chamber to grow the buffer layer made of silicon doped gallium arsenide, wherein a growth thickness is 20 nm to 30 nm, and a doping concentration is about 3E17 $cm^{-3}$ to 1E18 $cm^{-3}$; feeding $PH_3$ into the reaction chamber, and feeding trimethyl indium and trimethyl aluminum at a temperature of 640° C. to 690° C. under a pressure of 40 torr to 50 torr, so as to grow silicon doped aluminum indium phosphide, wherein the growth thickness is about 400 nm to 600 nm, and the doping concentration is about 1E17 $cm^{-3}$ to 5E17 $cm^{-3}$; when the temperature in the reaction chamber is 630° C. to 680° C. and the pressure is 40 torr to 50 torr, alternately growing the quantum well layer and the quantum barrier layer on the N-type confinement layer, wherein the quantum well layer includes aluminum gallium indium phosphorus, and the number of aluminum atoms is 1.25% to 2.5% of the total number of atoms in the quantum well layer, the quantum barrier layer includes an aluminum gallium indium phosphorus layer, and the number of aluminum atoms is 15% to 17.5% of the total number of atoms in the quantum barrier layer, the thickness of the quantum well layer is between 5 nm and 8 nm, the thickness of the first quantum barrier layer is between 8 nm and 12 nm, and there is one second quantum barrier layer with a thickness between 70 nm to 140 nm; raising the temperature in the reaction chamber to 640° C. to 690° C., maintaining the pressure at 40 torr to 50 torr, and feeding trimethyl aluminum and trimethyl indium to grown the P-type confinement layer, wherein the growth thickness is 600 nm to 800 nm, the doping elements are magnesium, zinc or carbon, and the doping concentration is 1E18 $cm^{-3}$ to 6E18 $cm^{-3}$; maintaining the temperature in the reaction chamber at 640° C. to 690° C., maintaining the pressure at 40 torr to 50 torr, and feeding trimethyl gallium, trimethyl aluminum and trimethyl indium, so as to grow the transition layer made of aluminum gallium indium phosphorus doped with magnesium, zinc or carbon, wherein the growth thickness is 30 nm to 80 nm; growing the window layer made of gallium phosphide doped with magnesium, zinc or carbon in a manner of making the trimethyl indium and the trimethyl aluminum gradient or linear gradient to 0, wherein the doping concentration gradient or linear gradient from $5E18$ cm$^{-3}$ to $1E19$ cm$^{-3}$; and feeding trimethyl gallium into the reaction chamber, so as to grow the window layer made of gallium phosphide doped with magnesium, zinc or carbon elements, wherein the growth thickness is 2000 nm to 3000 nm, controlling the temperature in the reaction chamber from 700° C. to 640° C. gradient, and making the doping elements increase from $4E19$ cm$^{-3}$ to $9E19$ cm$^{-3}$ according to an epitaxial growth direction. Of course, those skilled in the art can also control the temperature and pressure within other ranges, the constituent material of each layer in the LED epitaxial structure can also be other materials, the doping elements can also be selected from other elements, the doping concentrations can also be adjusted based on actual conditions, and the gas introduced in the process can also be other gases.

In a specific embodiment, PH3 is fed into the reaction chamber, and at a temperature of 640° C. to 690° C. and a pressure of 40 torr to 50 torr, trimethyl indium and trimethyl aluminum are fed to grow silicon doped aluminum indium phosphide with a growth thickness of about 400 nm to 600 nm and a doping concentration of about $1E17$ cm$^{-3}$ to $5E17$ cm$^{-3}$. When the temperature in the reaction chamber is 630° C. to 680° C. and the pressure is 40 torr to 50 torr, before the quantum well layer and the quantum barrier layer are alternately grown on the N-type confinement layer, the method further includes: at a temperature of 650° C. and a pressure of 50 torr, feeding trimethyl gallium, trimethyl aluminum and trimethyl indium to grow a first spacer layer made of silicon doped aluminum gallium indium phosphorus, wherein the growth thickness is 150 nm, and the doping concentration is about $2E17$ cm$^{-3}$.

In another specific embodiment, when the temperature in the reaction chamber is 630° C. to 680° C. and the pressure is 40 torr to 50 torr, after the quantum well layer and the quantum barrier layer are alternately grown on the N-type confinement layer, the temperature in the reaction chamber is raised to 640° C. to 690° C., the pressure is kept at 40 torr to 50 torr, trimethyl aluminum and trimethyl indium are fed to grow the P-type confinement layer, the growth thickness is 600 nm to 800 nm, the doping elements are magnesium, zinc or carbon, and the doping concentration is between $1E18$ cm$^{-3}$ and $6E18$ cm$^{-3}$. The method further includes: continuing to grow a second spacer layer, wherein the material composition of the second spacer layer is the same as the material of the quantum barrier layer, the growth thickness is about 100 nm, and the second spacer layer is not doped.

In a specific embodiment, M is 20, the material of the quantum well layer is aluminum gallium indium phosphorus, and the number of aluminum atoms is 2% of the total number of atoms in the quantum well layer, the material of the quantum barrier layer is aluminum gallium indium phosphorus, and the number of aluminum atoms is 16.25% of the total number of atoms in the quantum barrier layer, the thickness of the quantum well layer is 5 nm, the thickness of the first quantum barrier layer is 8 nm, there is one second quantum barrier layer with a thickness of 80 nm, the second quantum barrier layer is located in the 10-th well-barrier period, and the entire active layer is not doped. Of course, the number of aluminum atoms can also accounts for other values in the total number of atoms in the quantum well layer, the number of aluminum atoms can also accounts for other values in the total number of atoms in the quantum barrier layer, the thickness of the quantum well layer can also be other values, the thickness of the first quantum barrier layer can also be other values, there may be a plurality of second quantum barrier layers, and the thickness of which can also be other values, the position of the second quantum barrier layer can also be adjusted, and those skilled in the art can make a choice according to actual situations.

Based on the same inventive concept, the present disclosure further provides a light emitting device, including any of the above LED epitaxial structures or the above LED epitaxial structure manufactured by any of the above manufacturing methods.

The light emitting device includes any of the above LED epitaxial structures or the above LED epitaxial structure manufactured by any of the above manufacturing methods. Compared with the prior art, the light emitting device of the present disclosure has the advantages that: quantum well pairs composed of a plurality of alternate quantum well layers and quantum barrier layers are disposed on an active layer, thereby ensuring a greater number of quantum well pairs within the range of a carrier diffusion length, and the second quantum barrier layer is disposed between the two first quantum barrier layers, which can achieve a better blocking effect on carriers, thereby improving the light conversion efficiency of an LED, and then the luminous efficiency of the LED is improved, and the problem of low luminous efficiency of the existing LEDs is also well alleviated.

In a practical application process, the light emitting device further includes an electrode. In addition, the LED can be a small-sized LED, such as a Mini LED (Mini Light Emitting Diode) or a Micro LED (Micro Light Emitting Diode).

Based on the same inventive concept, the present disclosure further provides a display panel, including the above light emitting device.

The above display panel includes the above light emitting device. Compared with the prior art, the display panel of the present disclosure has the advantages that: quantum well pairs composed of a plurality of alternate quantum well layers and quantum barrier layers are disposed on the active layer, thereby ensuring a greater number of quantum well pairs within the range of a carrier diffusion length, and the second quantum barrier layer is disposed between the two first quantum barrier layers, which can achieve a better blocking effect on carriers, thereby improving the light conversion efficiency of an LED, and then the luminous efficiency of the LED is improved, the problem of low luminous efficiency of the existing LEDs is also well alleviated, and a better display effect of the display panel is ensured.

It should be understood that, the application of the present disclosure is not limited to the above examples, those of ordinary skill in the art can make improvements or transformations according to the above descriptions, and all such improvements and transformations should fall within the protection scope of the appended claims of the present disclosure.

What is claimed is:

1. An LED epitaxial structure, comprising: a substrate, an N-type confinement layer, an active layer and a P-type confinement layer which are disposed in sequence from bottom to top, wherein the active layer comprises quantum well layers and quantum barrier layers, which are alternately disposed, a part of the quantum barrier layers are first quantum barrier layers, at least one of the quantum barrier layers is a second quantum barrier layer, the second quantum barrier layer is located between two first quantum barrier layers, and a thickness of the second quantum barrier layers is greater than a thickness of the first quantum barrier layers.

2. The LED epitaxial structure according to claim 1, wherein a well-barrier period is formed by one of the quantum well layers and one of the quantum barrier layers, which are adjacent to each other, the active layer comprises M well-barrier periods, and the second quantum barrier layer is located between a (M/3)-th well-barrier period and a (2M/3)-th well-barrier period, wherein M is a positive integer greater than or equal to 15.

3. The LED epitaxial structure according to claim 1, wherein the LED epitaxial structure further comprises:
a spacer layer, which is disposed between the N-type confinement layer and the active layer.

4. The LED epitaxial structure according to claim 1, wherein the LED epitaxial structure further comprises:
a spacer layer, which is disposed between the active layer and the P-type confinement layer.

5. The LED epitaxial structure according to claim 1, wherein the LED epitaxial structure further comprises:
a first spacer layer, which is disposed between the N-type confinement layer and the active layer; and
a second spacer layer, which is disposed between the active layer and the P-type confinement layer.

6. The LED epitaxial structure according to claim 1, wherein the LED epitaxial structure further comprises:
a distributed Bragg reflection composite structure, comprising a first reflectivity layer and a second reflectivity layer, which are disposed in a cyclically and alternately manner, wherein a reflectivity of the first reflectivity layer is less than a reflectivity of the second reflectivity layer.

7. The LED epitaxial structure according to claim 6, wherein the distributed Bragg reflection composite structure comprises, according to its growth direction, at least one stage of the composite sub-structures, wherein each stage of the composite sub-structures comprises several pairs of the first reflectivity layers and the second reflectivity layers, which grow in a cyclically and alternately manner.

8. The LED epitaxial structure according to claim 7, wherein the distributed Bragg reflection composite structure comprises, according to its growth direction, a first composite sub-structure, a second composite sub-structure and a third composite sub-structure, and reflection wavelengths of the first composite sub-structure, the second composite sub-structure and the third composite sub-structure gradually decrease.

9. The LED epitaxial structure according to claim 8, wherein the number of alternating periods of the first reflectivity layer and the second reflectivity layer in the first composite sub-structure is less than the number of alternating periods of the first reflectivity layer and the second reflectivity layer in the second composite sub-structure, and the number of the alternating periods of the first reflectivity layer and the second reflectivity layer in the second composite sub-structure is less than the number of alternating periods of the first reflectivity layer and the second reflectivity layer in the third composite sub-structure.

10. The LED epitaxial structure according to claim 1, wherein a sum of thicknesses of all the second quantum barrier layers is between 70 nm and 140 nm.

11. A manufacturing method of an LED epitaxial structure, comprising:
providing a substrate;
disposing an N-type confinement layer on the substrate;
alternately disposing quantum well layers and quantum barrier layers on an exposed surface of the N-type confinement layer, so as to form an active layer, wherein a part of the quantum barrier layers are first quantum barrier layers, at least one of the quantum barrier layers is a second quantum barrier layer, the second quantum barrier layer is located between two first quantum barrier layers, and a thickness of the second quantum barrier layers is greater than a thickness of the first quantum barrier layers; and
disposing a P-type confinement layer on an exposed surface of the active layer.

12. The manufacturing method of the LED epitaxial structure according to claim 11, wherein the step of forming the active layer comprises:
periodically growing the quantum well layers and the first quantum barrier layers on the N-type confinement layer, so as to form N well-barrier periods, wherein one of the well-barrier periods comprises one of the quantum well layers and one of the first quantum barrier layers, which are adjacent to each other, N is an integer less than M/3, and M is a positive integer greater than or equal to 15;
alternately growing the quantum well layers and the quantum barrier layers on the N well-barrier periods, so as to form N well-barrier periods, wherein at least one of the well-barrier periods comprises the second quantum barrier layer; and
alternately growing the quantum well layers and the first quantum barrier layers on 2N well-barrier periods, so as to form (M−2N) well-barrier periods.

13. The manufacturing method of the LED epitaxial structure according to claim 12, wherein,
after disposing the N-type confinement layer, and before disposing the active layer, the manufacturing method further comprises:
reducing a reaction temperature after growing the N-type confinement layer, and growing a first spacer layer at the reaction temperature.

14. The manufacturing method of the LED epitaxial structure according to claim 12, wherein,
after disposing the active layer, and before disposing the P-type confinement layer, the manufacturing method further comprises:
growing a second spacer layer on the active layer, increasing the reaction temperature after growing the second spacer layer, and growing the P-type confinement layer at the reaction temperature.

15. The manufacturing method of the LED epitaxial structure according to claim 12, wherein,
after disposing the N-type confinement layer, and before disposing the active layer, the manufacturing method further comprises: reducing the reaction temperature after growing the N-type confinement layer, and growing the first spacer layer at the reaction temperature; and
after disposing the active layer, and before disposing the P-type confinement layer, the manufacturing method further comprises: growing the second spacer layer on the active layer, increasing the reaction temperature after growing the second spacer layer, and growing the P-type confinement layer at the reaction temperature.

16. The manufacturing method of the LED epitaxial structure according to claim 13, wherein after growing the N-type confinement layer, reducing the reaction temperature between 630° C. and 680° C.

17. The manufacturing method of the LED epitaxial structure according to claim 14, wherein after growing the second spacer layer is grown, raising the reaction temperature between 640° C. and 690° C.

18. The manufacturing method of the LED epitaxial structure according to claim 11, wherein before disposing the N-type confinement layer, the manufacturing method further comprises:
   periodically growing a first reflectivity layer and a second reflectivity layer on the substrate, so as to form a distributed Bragg reflection composite structure, wherein a reflectivity of the first reflectivity layer is less than a reflectivity of the second reflectivity layer.

19. A light emitting device, comprising:
   an LED epitaxial structure, wherein the LED epitaxial structure comprising a substrate, an N-type confinement layer, an active layer and a P-type confinement layer which are disposed in sequence from bottom to top,
   wherein the active layer comprises quantum well layers and quantum barrier layers, which are alternately disposed, a part of the quantum barrier layers are first quantum barrier layers, at least one of the quantum barrier layers is a second quantum barrier layer, the second quantum barrier layer is located between two first quantum barrier layers, and a thickness of the second quantum barrier layers is greater than a thickness of the first quantum barrier layers.

20. A display panel, comprising the light emitting device according to claim 19.

* * * * *